United States Patent [19]

Sawada et al.

[11] Patent Number: 4,794,215

[45] Date of Patent: Dec. 27, 1988

[54] PUSH SWITCH SEALED AGAINST CONTAMINANTS

[75] Inventors: Masaki Sawada, Osaka; Futoshi Matsui, Hirakata; Katsuyoshi Onda, Katano, all of Japan

[73] Assignee: Matsushita Electric Industrial Co., Ltd., Osaka, Japan

[21] Appl. No.: 878,974

[22] PCT Filed: Sep. 26, 1985

[86] PCT No.: PCT/JP85/00533

§ 371 Date: Aug. 8, 1986

§ 102(e) Date: Aug. 8, 1986

[87] PCT Pub. No.: WO86/02196

PCT Pub. Date: Apr. 10, 1986

[30] Foreign Application Priority Data

| | | | |
|---|---|---|---|
| Sep. 29, 1984 | [JP] | Japan | 59-202988 |
| Sep. 29, 1984 | [JP] | Japan | 59-202989 |
| Nov. 22, 1984 | [JP] | Japan | 59-247149 |

[51] Int. Cl.$^4$ .......... H01L 13/02

[52] U.S. Cl. .......... 200/159 B; 200/305; 200/5 A; 200/302.2

[58] Field of Search .......... 200/304, 305, 159 A, 200/159 B, 5 A, 67 DA, 67 DB, 302.2, 340

[56] References Cited

U.S. PATENT DOCUMENTS

| | | | |
|---|---|---|---|
| 2,409,483 | 10/1946 | Gandelot | 200/302.2 X |
| 2,457,153 | 12/1948 | Hubbell | 200/159 A |
| 3,049,602 | 8/1962 | Flatt et al. | 200/302.2 X |
| 3,600,528 | 8/1971 | Leposavic | 200/5 A |
| 3,643,041 | 2/1972 | Jackson | 200/5 A |
| 3,684,842 | 8/1972 | Boulanger | 200/5 R |
| 3,742,157 | 6/1973 | Leposavic | 200/5 A |
| 3,806,673 | 4/1974 | Boulanger | 200/5 A |
| 3,808,384 | 4/1974 | Boulanger | 200/5 A |
| 4,018,999 | 4/1977 | Robinson et al. | 200/5 A |
| 4,121,070 | 10/1978 | Silbernagel | 200/67 DB |
| 4,125,934 | 11/1978 | Keough et al. | 200/159 B X |
| 4,263,485 | 4/1981 | Corwin | 200/5 A |
| 4,405,845 | 9/1983 | Kondo et al. | 200/159 A X |
| 4,463,233 | 7/1984 | Tanabe | 200/159 A |
| 4,652,706 | 3/1987 | Rao et al. | 200/67 D |
| 4,678,880 | 7/1987 | Koizumi et al. | 200/340 |

FOREIGN PATENT DOCUMENTS

| | | | |
|---|---|---|---|
| 777879 | 2/1968 | Canada | 200/67 DA |
| 1113143 | 11/1981 | Canada | 200/305 |
| 52705 | 12/1968 | German Democratic Rep. | 200/302.2 |
| 54-63279 | 5/1979 | Japan . | |
| 57-150499 | 9/1982 | Japan . | |
| 58-49546 | 11/1983 | Japan . | |
| 59-166327 | 11/1984 | Japan . | |
| 545991 | 2/1974 | Switzerland | 200/159 A |
| 2140623 | 11/1984 | United Kingdom | 200/302.2 |

*Primary Examiner*—Henry J. Recla
*Assistant Examiner*—Ernest G. Cusick
*Attorney, Agent, or Firm*—Stevens, Davis, Miller & Mosher

[57] ABSTRACT

A push switch having a mount base 11 made of a heat resisting and insulating material and having a recess 11*a* in the top surface thereof, the recess 11*a* receiving a plurality of contact terminals 12*a*, 13*a* disposed such that contact portions constituting at least a pair of conductor circuits are arranged in the recess, a curved push spring 14 having an inverting function and disposed in the recess 11*a*, and an operating portion through which the push spring 14 is operated so as to turn the switch on and off. A flexible heat resistant film 15 constituting the operating portion is attached to the mount base in a manner such as to cover the entire area of opening of the recess. With this dust proof and semi-hermetic arrangement, it is possible to prevent invasion by dusts and other foreign matters which are strictly to be kept away from the switch. The invasion by flux and molten solder also is avoided so that the switch can be manufactured by new methods such as solder dipping.

5 Claims, 5 Drawing Sheets

PUSH SWITCH SEALED AGAINST CONTAMINANTS

TECHNICAL FIELD

The present invention relates to a push switch which is widely used in keyboards and other inputting manipulation means such as those in video tape recorders, particularly of the type having a mount base made of a heat resisting and insulating material and having a recess in the top surface thereof, the recess receiving a plurality of contact terminals disposed such that contact portions constituting at least a pair of conductor circuits are arranged in the recess, a curved push spring having an inverting function and disposed in the recess, and an operating portion through which the push spring is operated.

PRIOR ART

FIG. 1 shows the construction of a known push switch of the type mentioned above.

Referring to this Figure, a mount base 1 has a circular recess 1*a* formed in the top side thereof. Contact terminals 2*a*, 3*a* constituting a conductive circuit are fixed by insertion molding such that the contact portions of these contact terminals are disposed on the bottom surface of the recess. These contact terminals 2*a* and 3*a* are extended to the outside of the mount base 1, so as to form external terminals 2*b*, 3*b*. A reference numeral 4 denotes a disc-shaped push spring having an inverting function and curved to convex upwardly. The push spring 4 is so shaped that it always contacts with the contact terminals 2*a* but is normally kept away from the contact terminal 3*a*. A reference numeral 5 designates a circular push plate which has a projection 5*a* projecting from the central portion of the lower surface thereof, so as to lightly press the upper surface of the push spring thereby preventing any play of the push spring 4. On the other hand, a projection 5*b* is formed on the upper side of the push plate so as to be depressed by a finger when the switch is operated. The push plate 5 is received in the recess 1*a* in the mount base 1 with a slight play so that it can be moved downward against the force of the push spring 4 when pushed. The push plate 5 is held by a cover plate 6 fixed to the mount base by means of caulking tabs 1*b* provided on the mount base 1. In the normal state of the switch, the push spring contacts only the contact terminals 2*a* so that the switch is in OFF state. As the push plate 5 is pressed against the biasing force of the push spring 4, the push spring contacts also the contact terminal 3*a*, whereby the switch is turned on. However, the switch is turned off again as the push plate 5 is released from the pressing force.

In loading this switch on a printed circuit board by soldering, it is necessary to dip the terminals 2*b* and 3*b* in a soldering flux solution. It is often experienced that, when the height of the push switch is small, the flux comes into the switch through a minute gap between the cover plate 6 and the push plate 5, partly because of a capillary action and partly because of flying of the flux particles. It is also experienced that the dust and other foreign matters, as well as the chips of the ground push plate 5, come into the switch so as to cause a bad contact in the switch.

On the other hand, there is an increasing demand for a reduction in the size and thickness of the switch, which in turn has given rise to the demand for development of a new push switch which can be loaded by re-flow soldering or solder dipping. The conventional push switch, however, cannot meet such a demand.

SUMMARY OF THE INVENTION

According to the invention, there is provided a push switch having a mount base made of a heat resisting and insulating material and having a recess in the top surface thereof, the recess receiving a plurality of contact terminals disposed such that contact portions constituting at least a pair of conductor circuits are arranged in the recess, a curved push spring having an inverting function and disposed in the recess, and an operating portion through which the push spring is operated so as to turn the switch on and off, the operating portion being constituted by a flexible heat resistant film attached to the mount base in a manner such as to cover the entire area of opening of the recess.

It is, therefore, possible to obtain a dust-proof and semi-hermetic switch assembly without complicating the construction, thereby effectively preventing invasion, into the switch, of dust and other foreign matters which have to be strictly kept out of the switch. The use of the heat resistant film also prevents the flux and molten solder from coming into the switch, so that the push switch can be produced by the new loading technic such as solder dipping or re-flow type soldering.

BRIEF DESCRIPIION OF THE DRAWINGS

DESCRIPTION OF THE PREFERRED EMBODIMENT

Figure 1:
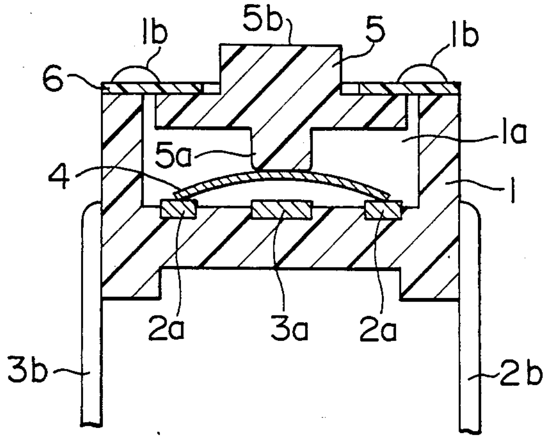
FIG. 1 PRIOR ART
FIG. 1 is a sectional view of a conventional push switch.
Figure 2:
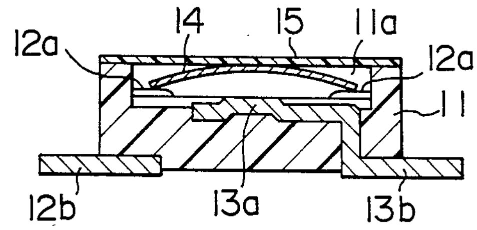
FIG. 2 is a sectional view of a push switch in accordance with a first embodiment of the invention.

FIG. 2 shows the construction of a known push switch of the type mentioned above.

Referring to this Figure, a mount base 11 has a circular recess 11*a* formed in the top side thereof. Contact terminals 12*a*, 13*a* constituting a conductive circuit are fixed by insertion molding such that the contact portions of these contact terminals are disposed on the bottom surface of the recess. These contact terminals 12*a* and 13*a* are extended to the outside of the mount base 11, so as to form external terminals 12*b*, 13*b*. A reference numeral 14 denotes a disc-shaped push spring having an inverting function and curved to convex upwardly. The push spring 14 is so shaped that it always contacts with the contact terminals 12*a* but is normally kept away from the contact terminal 13*a*. A reference numeral 15 denotes a flexible heat resistant film which is made of, for example, polyimide film. The heat resistant film 15 is adhered to the upper side of the mount base 11 in a manner such as to cover the entire area of the opening of the recess 11*a*. The heat resistant film 15 is contacted at the central portion of the lower surface thereof by the central portion of the push spring 14, whereby the push spring 14 is retained within the recess 11*a* of the mount base 11.

In the normal state of use, the push spring 14 makes contact only with the contact terminals 12*a* so that the switch is in OFF state. However, as the heat resistant film 15 is lightly pressed against the biasing force of the push spring 14, the push spring 14 contacts also with the contact terminal 13*a*, whereby the switch is turned on. However, as the heat resistant film is released from the biasing force, the switch is turned off again.

Figure 3:
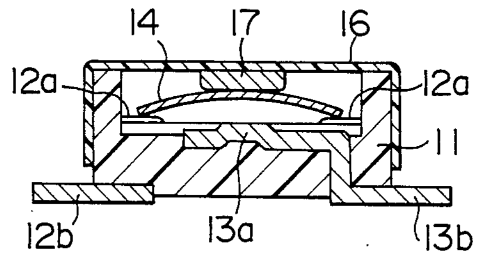
FIG. 3 is a sectional view of a modification of the push switch of the first embodiment.

FIG. 3 is a sectional view of a modification of the embodiment shown in FIG. 2. In this embodiment, a heat resistant film 16 which extends to cover both sides of the mount base 11 is used in place of the film 15 in the first embodiment. Thus, the heat resistant film 16 is adhered not only to the upper surface of the mount base 11 but also to both side surfaces of the same, thereby improving the strength of bonding between the film 16 and the mount base 11. A pressing portion 17 contacting the push spring 14 and made of a metal such as bronze is fixed to the center of the lower side of the heat resistant film 16 by, for example, bonding, thereby improving the operation characteristics. For attaining a higher stability, the pressing portion 17 is preferably made of a metal, although it may be made of a resin.

Figure 4:
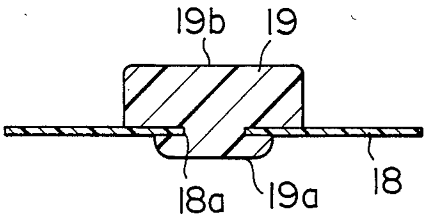
FIG. 4 is a sectional view of a part which is obtained by fastening a push button to the heat resistant film in the first embodiment.
Figure 5:
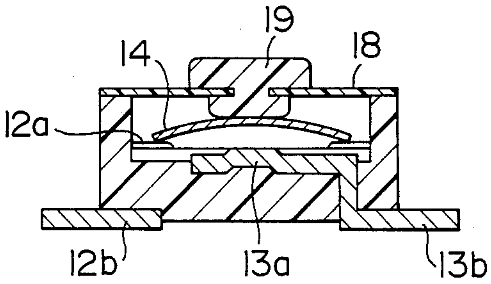
FIG. 5 is a sectional view of a push switch of another modification of the first embodiment, incorporating the part shown in FIG. 4.

In another modification shown in FIG. 4, a heat resistant film 18 having a central bore 18*a* is used in place of the heat resistant film 15 of the first embodiment, and a push button 19 having a pressing portion 19*a* and a button portion 19*b* and made of a heat resistant resin is integrated with the heat resistant film 18 by outserting method such that the pressing portion 19*a* and the button portion 19*b* project from the lower side and upper side of the heat resistant film 18, respectively. FIG. 5 shows a push switch which exhibits superior stability and operation characteristics when operated, by virtue of the use of the arrangement shown in FIG. 4.

Figure 6:
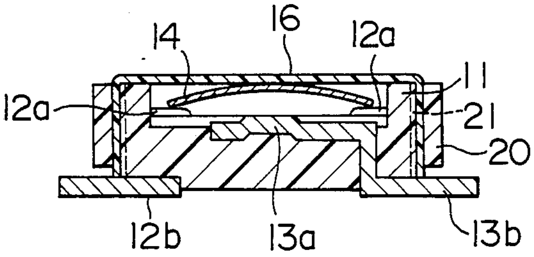
FIG. 6 is a sectional view of a second embodiment of the push switch in accordance with the invention.

FIG. 6 shows a push switch in accordance with a second embodiment of the invention. This embodiment also incorporates a heat resistant film 16 adhered not only to the upper surface but also to the side surface of the mount base 11 by a bond. In order to ensure a high strength of bonding of the heat resistant film 16 to the mount base 11, a heat shrinkable tube 20 is provided on the side surface of the mount base 11, with the heat resistant film 16 sandwiched therebetween. In addition, at least one minute air vent hole 21 is provided in the side wall of the mount base 11, so as to permit the air to pass therethrough in response to the pressure change in the switch, thereby preventing reduction in the reliability due to change in the heat condition.

Figure 7:
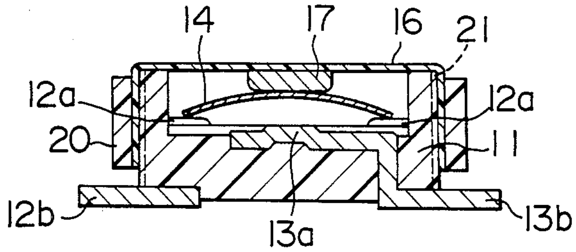
FIG. 7 is a sectional view of a second embodiment of the invention.

FIG. 7 shows a modification in which a pressing portion 17 is provided as in the case of the embodiment shown in FIG. 3.

Figure 8:
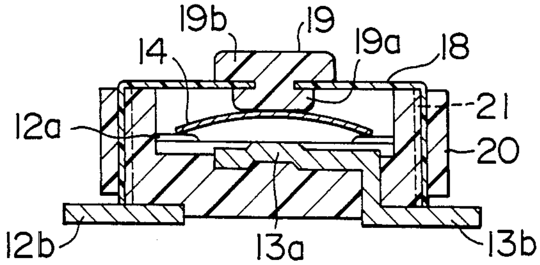
FIG. 8 is a sectional view of a modification of the second embodiment.
Figure 9:
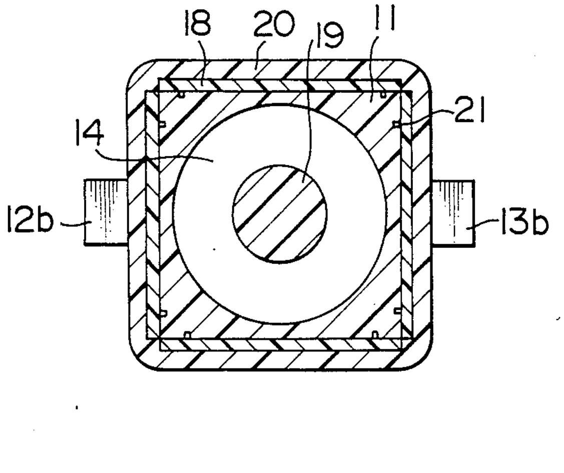
FIG. 9 is a sectional view of the push switch shown in FIG. 8 as viewed from the upper side thereof.

FIGS. 8 and 9 show still another modification of the embodiment shown in FIG. 6. This modification has the heat resistant film 18 and the push button 19 of the same type as those shown in FIG. 5.

Figure 10:
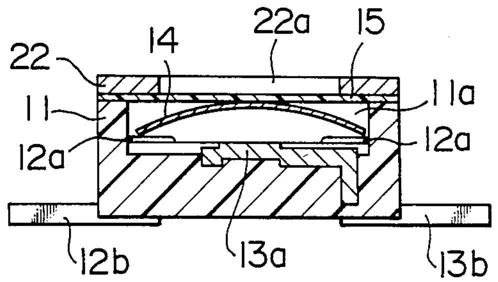
FIG. 10 is a sectional view of a third embodiment of the push switch in accordance with the invention.

FIG. 10 shows a third embodiment of the push switch of the invention. In this embodiment, a cover 22 made of a conductive metal which is considered as being not solderable, e.g., aluminum or a stainless steel, is provided on the heat resistant film 15 which in turn is fixed to the upper surface of the mounting base 11. This cover 22 is provided with a central circular hole 22*a* through which the finger can have access to the central portion of the heat resistant film 15 so as to manipulate the latter. The cover 22 is fixed to the mount base 11 by caulking, with the heat resistant film 15 sandwiched therebetween.

Figure 11:
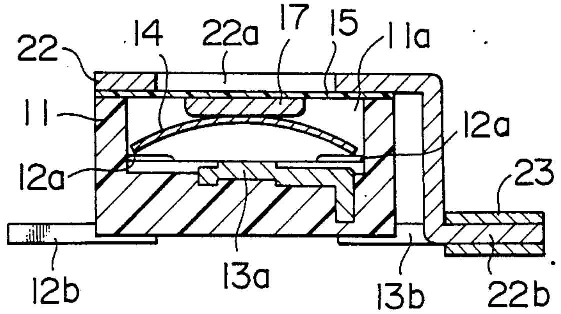
FIGS. 11 and 12 are sectional views of a third embodiment of the invention.

FIG. 11 shows a modification of the embodiment shown in FIG. 10. This modification has a pressing portion 17 similar to those shown in FIGS. 3 and 7. In addition, the cover 22 has an extension 22*b* which is coated with a coating layer 23 of a solderable conductive metal. The coating layer 23 serves as a grounding terminal which grounds the cover 22 thereby eliminating electrostatic noise.

Figure 12:
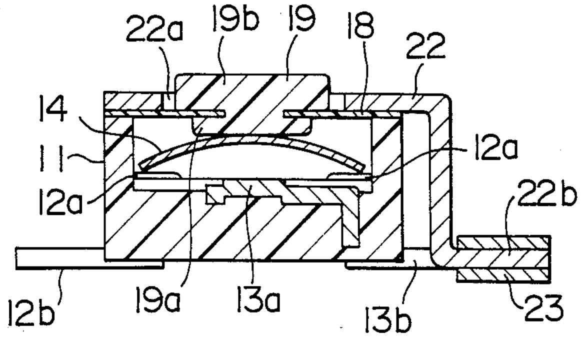
Figure 13:
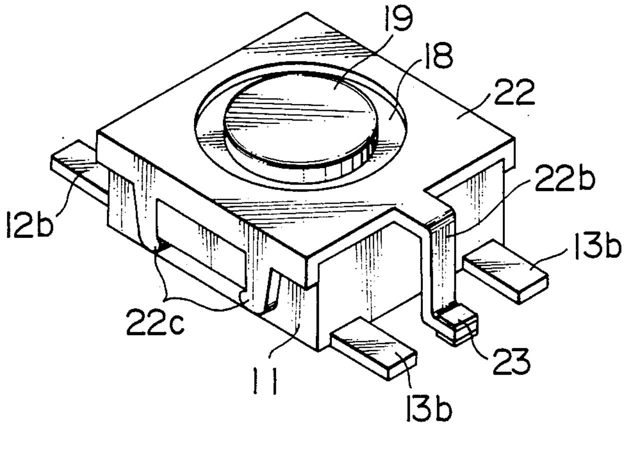
FIG. 13 is a perspective view of the push switch shown in FIG. 12.

FIGS. 12 and 13 show another modification of the embodiment shown in FIG. 10. This modification has the heat resistant film 18 and the button 19 with the pressing portion 19*a* and the button portion 19*b* which are similar to those shown in FIGS. 5 and 8. The button portion 19*b* projects above the cover 22 through the central hole 22*a*. In FIG. 13, a reference numeral 22*c* designates a caulking portion by which the cover 22 is fixed to the mounting base 11.

In the push switches of the embodiment shown in FIGS. 10 to 13, the cover 22 made of a conductive metal which can hardly be soldered and covering the heat resistant film 15, 18 minimizes the risk of breakage of the heat resistant film 15 or 18 by a member having a keen edge, as well as the risk of separation of the heat resistant film, which may occur when the heat resistant film 15 or 18 is exposed. In addition, solderable extension of the cover 22 provides a grounding function.

In the described embodiments, the contact terminals are shown to extend in the horizontal direction and illustrated only in cross-section, it will be clear that the invention can be effectively applied regardless of the outer configuration of the push switch, e.g., round or polygonal. It will be understood also that the number of the conductor circuits constituted by the contact terminals is not limited to two, although the described embodiments incorporate a pair of conductor circuits.

INDUSTRIAL APPLICABILITY

As has been described, according to the invention, it is possible to obtain a push switch having a dust-proof and semi-hermetic construction, without causing any complication of the construction, whereby dust and other foreign matters, which are strictly to be kept away from the switch, are prevented from coming into the switch, thereby minimizing the risk of bad contact in the switch attributable to the invasion by dust and foreign matters. In addition, since the use of the heat resistant film eliminates the possibility of invasion by flux and molten solder it becomes possible to adopt new loading technic such as solder dipping and re-flowing, thus coping with the demand in the field of industry concerned. Furthermore, the necessity for the caulking tabs, which heretofore have been necessary in the conventional switch, is eliminated. It is to be understood also that the size of the push switch can be minimized without impairing the reliability, by virtue of the use of the flexible thin film on the upper side of the push switch, thus complying with the demand for reduction in the weight, thickness and size of the switch. When a cover of a member made of a conductive metal to which the solder can hardly be deposited is provided to cover the heat resistant film, the risk of damaging of the heat resistant film by stubbing, as well as the risk of separation of the heat resistant film which is liable to occur when the film is uncovered, is minimized. Furthermore, a grounding function is attained by allowing soldering on one end of the cover. At least one air vent hole provided in the side wall of the mount base permits air to pass therethrough in response to a change in the internal pressure of the switch, thereby avoiding any unfavorable effect of change in the heat condition on the reliability of the push switch.

We claim:

1. A push switch comprising a mount base made of a heat resisting and insulating material and having a recess in a top surface thereof, which defines a recess opening, said recess having a plurality of contact terminals disposed therein, external terminals connected to said contact terminals and having planar surface portions which are adapted to be in surface contact with a planar electrode pattern on a circuit board, a curved push spring having an inverting function and disposed in said recess, and an operating portion through which said push spring is operated, said operating portion being formed by a flexible heat resistant film which is hermetically attached to said mount base to cover the entirety of said recess opening; and a cover made of a material substantially resistant to solder deposition, said cover covering the entire area of said heat resistant film except the central portion of said film.

2. A push switch according to claim 1, further comprising a pressing portion provided on the lower surface of said heat resistant film to contact said push spring, said pressing portion being made of a metal or a plastic.

3. A push switch according to claim 1, wherein a button is integrated with said heat resistant film, said button having a button portion projecting above an upper surface of said heat resistant film and a pressing portion projecting below a lower surface of said heat resistant film so as to contact said push spring, said button portion and said pressing portion being made of plastic material, said button portion projecting above said cover.

4. A push switch according to claim 1, wherein said cover has an extension which is coated by a coating layer made of a solderable conductive metal.

5. A push switch comprising a mount base made of a heat resisting and insulating material and having a recess in a top surface thereof, which defines a recess opening, said recess having a plurality of contact terminals disposed therein, external terminals connected to said contact terminals and having planar surface portions which are adapted to be in surface contact with a planar electrode pattern on a circuit board, a curved push spring having an inverting function and disposed in said recess, an operating portion through which said push spring is operated, said operating portion being formed by a flexible heat resistant film which is hermetically attached to said mount base to cover the entirety of said recess opening, and a cover made of a metallic material substantially resistant to solder deposition, said cover covering the entire area of said heat resistant film except the central portion of said film.

* * * * *